United States Patent [19]

Önnestam

[11] 4,112,501
[45] Sep. 5, 1978

[54] SYSTEM AND METHOD FOR LOADING COMPUTER DIAGNOSTIC PROGRAMS

[75] Inventor: Alf Gunnar Önnestam, Kungsängen, Sweden

[73] Assignee: Data General Corporation, Westboro, Mass.

[21] Appl. No.: 694,442

[22] Filed: Jun. 9, 1976

[51] Int. Cl.² .............................................. G06F 3/00
[52] U.S. Cl. ................................................... 364/900
[58] Field of Search ........................ 340/172.5; 445/1; 360/2, 40, 43; 364/200, 600, 200 MS, 900 MS; 307/210, 234; 40/2 R

[56] References Cited

U.S. PATENT DOCUMENTS

| 2,247,905 | 7/1941 | Bryce | 340/2 X |
|---|---|---|---|
| 2,870,429 | 1/1959 | Hales | 340/172.5 X |
| 3,077,564 | 2/1963 | Forrer | 307/210 |
| 3,543,241 | 11/1970 | Leuck | 40/2 R X |
| 3,624,615 | 11/1971 | Lippold et al. | 340/172.5 |
| 3,646,534 | 2/1972 | Miller | 340/60 |
| 3,975,622 | 8/1976 | Horn et al. | 364/900 X |
| 3,996,586 | 12/1976 | Dillon et al. | 360/40 |

OTHER PUBLICATIONS

System 900 for Computerized Ordering-Electronics Laboratories-4 pp., 1971.

*Primary Examiner*—Harvey E. Springborn
*Attorney, Agent, or Firm*—Donald Brown

[57] ABSTRACT

Portable system and method for loading diagnostic computer programs stored on a recording media of a recorder, the diagnostic program being stored on the recording media using two frequencies, one frequency representing a "zero" bit and the other frequency representing a "one" bit and the program being loadable into the computer memory by means which is adapted to convert the data into computer readable information.

5 Claims, 3 Drawing Figures

SYSTEM AND METHOD FOR LOADING COMPUTER DIAGNOSTIC PROGRAMS

BACKGROUND OF THE DISCLOSURE

This invention is directed to a new and improved portable system and method for loading diagnostic computer programs into a computer for the purpose of diagnosing computer malfunctions.

Field service engineering has as one of its major functions the rapid repair of computer malfunctions. Diagnostic computer programs play a large part in providing field service engineers with a powerful tool to permit rapid detection of the cause of computer malfunctions.

In the past the diagnostic computer programs were generally loaded into the computer memory from a punched paper tape and fed into the computer by a conventional paper tape reader coupled to the computer. While the use of paper tapes for diagnostic purposes are generally acceptable, paper tapes have limited storage capacity and are prone to be easily damaged if used continuously by field service personnel. In addition the feeding of the paper tape is quite time consuming and this does not lend itself readily to the rapid servicing of computer by field service personnel. Accordingly, a new and improved portable system was required for field service use to permit the rapid servicing of computers. In particular a system was required which could readily be carried about and which could use commercially available tape cassettes and portable audio tape recorders, so as to reduce manufacturing costs and facilitate construction thereof without having to make an investment in the design of a new tape recorder.

The system of this invention meets the above requirements.

BRIEF DESCRIPTION OF THE DISCLOSURE

This invention comprises in its most preferred form an audio cassette tape recorder with a device to permit a conventional tape prerecorded with diagnostic computer programs in the manner as disclosed herein to be controlled to load the diagnostic programs into the memory of a computer. In this system the recorder is manually operable to read data into the computer. The data is recorded on magnetic tape at two different audio frequencies and is converted by the interface device of this invention into a train of pulses whose spacing with respect to one another indicates if the data represents a zero or a one bit.

DETAILED DESCRIPTION OF THE DISCLOSURE

Figure 1:
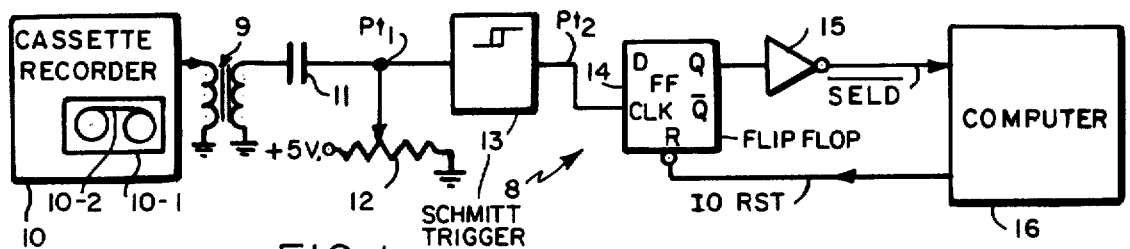
FIG. 1 is a block diagram of the system of the disclosure.

Reference should now be had to FIG. 1 which illustrates the preferred embodiment of the disclosure.

At 10 there is shown a conventional portable audio tape recorder (e.g., made by the SONY Corporation of Japan, Model TC-55) which is adapted to receive a conventional audio tape cassette 10-1 having a conventional two track magnetic recording tape 10-2. It is to be understood that other conventional portable audio tape recorders may be used for the purpose of this invention. At 9 there is shown a conventional audio transformer which is coupled to the output of the last stage power amplifier of the TC-55 (See the TC-55 Service Manual © 1972 by the SONY Corporation) for providing during playback of the tape 10-2, the audio signals (data) recorded on the tape to the interface device 8 of this invention.

The output from the transformer 9 is provided through a filter capacitor 11 to the input terminal of a conventional Schmitt trigger 13 (e.g., Texas Instruments No. 7414) whose input is biased above ground by a potentiometer 12 coupled to +5v. The output waveform from the Schmitt trigger 13 is then coupled to the C input of a D-type Flip Flop 14 (e.g., Signetics No. S 8828) and the Q output thereof is coupled to a conventional line driver 15 (e.g., Texas Instruments 75452) for feeding data into the computer 16. The computer may for example be any of the conventional computers sold by Data General Corporation of Southboro, Massachusetts, under the brand names NOVA or ECLIPSE.

The operation of the Flip Flop 14 is under control of timing signals (IORST) which are feed to the reset "R" terminal of the Flip Flop 14. The timing signals are preferably generated in a conventional manner by the computer 16 under program control but it should also be understood that a conventional clock providing timing pulses at fixed rate, e.g., about 350μs may be used to control the generation of the output signal identified as $\overline{SELD}$ if it is desired to produce $\overline{SELD}$ in order to test out the interface 8 apart from the computer.

Figure 2:
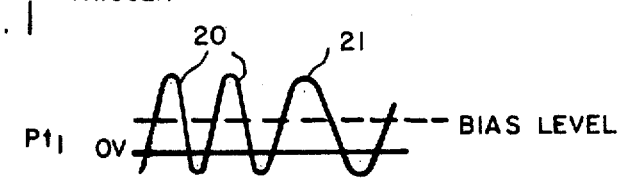
FIG. 2 is a timing diagram illustrating the data and the various signals generated by the system.

Reference should now be had to FIG. 2 in conjunction with FIG. 1 to illustrate the operation of the system of FIG. 1. The waveform shown as sine waves 20 and 21 represents the diagnostic program in terms of 1 and 0 bits stored on the tape 10-2. A sine wave 20 at an audio frequency of about 1.5KHZ represents a "1" bit and a sine wave 21 at an audio frequency of about 3KHZ represents a "0" bit of the stored program. At Point 1 the sine waves 20 and 21 are shown zeroed about the bias level established by potentiometer 12.

At Point 2, there is shown the output waveform corresponding to the points at which the sine wave voltage exceeds the input bias level of the Schmitt trigger circuit 13.

The remaining waveforms show that the Q output goes positive at each positive going transition input to the C input of Flip Flop 14 and returns to ground when IORST causes Flip Flop 14 to be reset. The $\overline{SELD}$ illustrates the spacing between generated pulses of a pulse train with a time spacing (bit cell boundary) between successive pulses of about 350μs representing a "0" bit and a time spacing of about 700μs between pulses representing a "1" bit.

Figure 3:
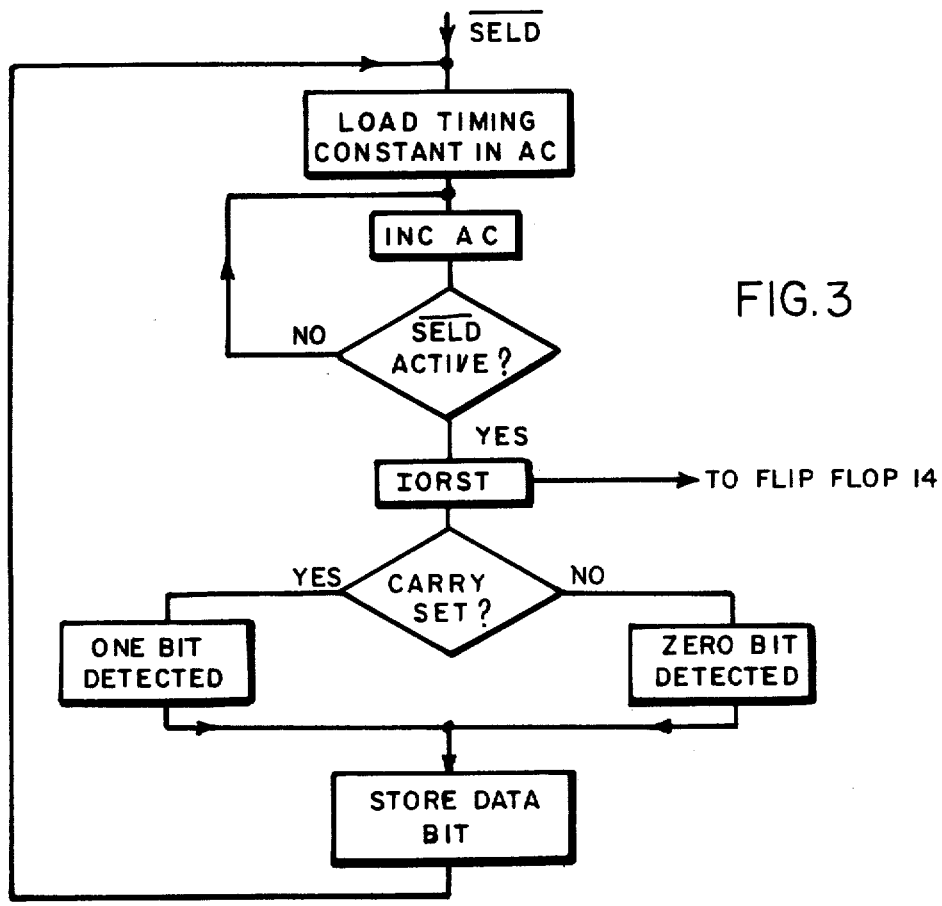
FIG. 3 is a flow chart illustrating the program for generating the IORST signals.

The $\overline{SELD}$ signal is cabled to the back panel of the computer, illustrated in copyrighted documents 012-000103-1 and 015-000009-09 dated 1974 and directed to a hardware description and programming procedures, respectively (e.g., a NOVA 840 computer) and a computer program generated in accordance with the flow chart shown in FIG. 3 when running will cause the recognition of the spacing between bits to determine if a "1" or a "0" bit is present, and also provide the IORST signal to reset Flip Flop 14. With the NOVA 840 computer the constant loaded in the accumulator would be 177603 in octal. The program written using conventional NOVA machine language according to the flow chart of FIG. 3 will also cause storing of the bits of the program in memory. As stated before, an external pulse generator could also provide the IORST timing signals in order to check out the interface device 9 after manually turning on the cassette recorder 10.

The information (data) may be conventionally prerecorded on the tape by generating square waves equal to 3 or 1.5KHZ using a general purpose computer or conventional square wave pulse generator; e.g., a computer coupled to a D type flip flop so that pulses are converted to voltage levels suitable for application to the record head of the recorder.

I claim:

1. Diagnostic computer program transfer system comprising a magnetic tape having a diagnostic computer program of 1 and 0 bits magnetically stored thereon at audio frequencies, a magnetic tape converter means for playing said magnetic tape and providing an electrical sinusoidal wave train of two different audio frequencies representing the 1 or 0 bits of the diagnostic computer program stored by said magnetic tape, wave shaping means for converting the sinusoidial wave train into a series of pulses of different widths depending upon the instantaneous frequency of the sinusoidal wave train, wave train generating means for generating a wave train of pulses from said series of pulses of different widths, the spacing between successive pulses representing either a 1 or 0 bit, a computer having storage means for receiving said wave train of pulses to thereby store said diagnostic computer program, and control means providing signals to control the generation of said wave train of pulses by said wave train generating means.

2. The system of claim 1 in which said control means is a portion of said computer and is responsive to said wave train of pulses.

3. The system of claim 2 in which said playback means comprises a cassette recorder.

4. The system of claim 3 in which wave shaping means comprises a Schmitt trigger.

5. The system of claim 3 in which said wave train generating means comprises a D-type flip-flop.

* * * * *